US012575130B2

(12) United States Patent
Wong

(10) Patent No.: US 12,575,130 B2
(45) Date of Patent: Mar. 10, 2026

(54) VARIABLE CHANNEL DOPING IN VERTICAL TRANSISTOR

(71) Applicant: San Jose State University Research Foundation, San Jose, CA (US)

(72) Inventor: Hiu Yung Wong, Cupertino, CA (US)

(73) Assignee: San Jose State University Research Foundation, San Jose, CA (US)

( * ) Notice: Subject to any disclaimer, the term of this patent is extended or adjusted under 35 U.S.C. 154(b) by 637 days.

(21) Appl. No.: 17/813,211

(22) Filed: Jul. 18, 2022

(65) Prior Publication Data

US 2023/0021938 A1     Jan. 26, 2023

Related U.S. Application Data

(60) Provisional application No. 63/223,459, filed on Jul. 19, 2021.

(51) Int. Cl.
*H10D 30/62*          (2025.01)
(52) U.S. Cl.
CPC ..... *H10D 30/6219* (2025.01); *H10D 30/6211* (2025.01)
(58) Field of Classification Search
CPC ........... H10D 30/6219; H10D 30/6211; H10D 30/668; H10D 62/393; H10D 62/155; H10D 62/157; H10D 62/8325
See application file for complete search history.

(56) References Cited

U.S. PATENT DOCUMENTS

| | | | |
|---|---|---|---|
| 6,573,561 B1 * | 6/2003 | Chidambarrao ..... | H10D 62/299 257/329 |
| 9,373,713 B2 | 6/2016 | Yen et al. | |
| 10,868,183 B2 | 12/2020 | More et al. | |
| 11,823,899 B1 * | 11/2023 | Goldsman ......... | H01L 21/02612 |
| 2004/0121572 A1 * | 6/2004 | Darwish ............. | H10D 30/668 257/E29.066 |
| 2016/0141412 A1 * | 5/2016 | Yen .................... | H10D 62/8325 257/77 |
| 2020/0091344 A1 | 3/2020 | Reznicek et al. | |
| 2022/0173237 A1 * | 6/2022 | Han .................... | H10D 89/611 |

FOREIGN PATENT DOCUMENTS

WO     2023004292 A1     1/2023

OTHER PUBLICATIONS

"International Application Serial No. PCT/US2022/073854, International Search Report mailed Oct. 4, 2022", 2 pgs.
"International Application Serial No. PCT/US2022/073854, Written Opinion mailed Oct. 4, 2022", 7 pgs.
(Continued)

*Primary Examiner* — William B Partridge
*Assistant Examiner* — Erik A. Anderson
(74) *Attorney, Agent, or Firm* — MLO, a professional corp.

(57) ABSTRACT

A vertical semiconductor transistor is provided that includes: a source region, a drain region, and a body region formed in a semiconductor substrate; wherein the source region and the drain region are doped with a first type dopant; wherein the body region is doped with a second type dopant; and wherein the second type dopant has a doping profile within the body region that varies with distance from the source region.

12 Claims, 8 Drawing Sheets

(56) References Cited

OTHER PUBLICATIONS

Monotonic, Analog Devices, retrieved on May 20, 2025, https://www.analog.com/en/resources/glossary/monotonic.html.

Pandey, Python Program to check if given array is Monotonic, Studytonight, Jul. 12, 2021, retrieved on May 20, 2025, https://www.studytonight.com/python-programs/python-program-to-check-if-given-array-is-monotonic.

Porta, Monotonic, Oxford Reference, A Dictionary of Epidemiology, 6 ed., Oxford University Press, 2016, retrieved on May 20, 2025, https://www.oxfordreference.com/display/10.1093/acref/9780199976720.001.0001/acref-9780199976720-e-1231.

Hong and Lee, Extraction of Metallurgical Effective Channel Length in LDD MOSFET's, IEEE Transactions on Electron Devices, vol. 42, No. 8, Aug. 1995, pp. 1461-1466.

Jaeger, Introduction to Microelectronic Fabrication: vol. 5 (Modular Series on Solid State Devices), Chapter 4, pp. 67-108, Oct. 2001.

* cited by examiner

VARIABLE CHANNEL DOPING IN VERTICAL TRANSISTOR

CROSS-REFERENCE TO RELATED APPLICATION

This patent application claims the benefit of U.S. Provisional Patent Application No. 63/223,459, filed Jul. 19, 2021, which is incorporated by reference herein in its entirety.

BACKGROUND

Power transistors are essential to make critical power circuits, in particular the power converter, smart (controlled digitally) and energy efficient. Critical power circuits are used, for example, in electrical vehicles, power grids, data centers, cell phone chargers and are expected to be everywhere in our daily life soon. Power electronic converters, processing over 50 percent of the world's electric energy, enable very efficient energy processing in a broad range of applications. It is projected by 2030, 80 percent of all electrical power generated will pass through power converters. Power transistors work as switches in these circuits. An ideal switch should have low resistance when the switch is closed i.e., low on-state resistance ($R_{ON}$), to reduce energy loss and heat generation. An ideal switch also should have a high breakdown voltage (BV) with low leakage current when the switch is opened, i.e., when the switch is in an off-state. A low breakdown voltage transistor can more easily conduct current in off-state, which can result in hazards and damages to the system. Power transistor design typically involves a trade-off between achieving a low on-state resistance $R_{ON}$ and achieving a high off-state breakdown voltage. Ordinarily, a power transistor does not achieve both low $R_{ON}$ and high BV.

A vertical power transistor switch in which current conducts from the top to the bottom of a wafer/die often is used for high-voltage applications. Moreover, wide-bandgap materials such as Silicon Carbide (SiC), often is used instead of Silicon nowadays for high-voltage applications, to increase the BV. As shown in FIG. 1, a vertical power transistor 100 typically has three regions, namely a source 102, a body 104, and a drain 106. The body 104 has an opposite type dopant than the source 102 and drain 106. Typically, doping is substantially uniform within the body region 104. The transistor 100 also includes a conductive gate structure 108 to impart a voltage to the body 104 to control transistor on/off state. Usually, there is an insulator region 110 between the gate 108 and the body 104, the source 102 and the drain 106. A normally off transistor ordinarily cannot conduct current in the absence of a gate voltage. However, when a sufficient gate voltage is applied, a region of the body near the gate insulator will change polarity to become the same polarity type as the source 102 and drain 106 in a process, which is called a charge inversion, and thus, transistor 100 will transition to an on-state and conduct current. The portion of the body region 104 where this inversion occurs is referred to as an inversion layer or as a conduction channel 112. An inversion layer is a layer in a semiconductor material where the type of the majority carriers changes to its opposite under certain conditions. When a sufficient gate voltage is applied, an inversion layer is formed that acts as a conduction channel 112 in which current can flow through the body region between the source and the drain. The voltage above which the inversion occurs in the channel 112 is referred to as the threshold voltage ($V_{TH}$). The conduction channel 112 can be located within the body 104 adjacent to the oxide/body interface, as shown in FIG. 1, or can be located at a region within the body region 104 that is spaced apart (not shown) from that interface, in which case the channel 112 is referred to as a buried conduction channel. Since the channel is a part of the body region 104, it is sometimes referred to as the channel/body.

SUMMARY

In one aspect, a vertical semiconductor transistor is provided that includes a source region, a drain region, and a body region. The body region is located between the source region and the drain region. The source region is doped with a first type dopant. The drain region is doped with the first type dopant. The body region is doped with a second type dopant. A doping profile of the second type dopant within the body region varies with distance from the source region.

In another aspect, a vertical Fin-FET semiconductor device includes a semiconductor substrate. A vertical semiconductor fin is formed in the semiconductor substrate. A source region is located within the semiconductor fin. A drain region is located within the fin. A body region is located at the fin between the source region and the drain region. First and second gate conductors are arranged along opposite vertical sidewalls of the fin. The source region is doped with a first type dopant. The drain region is doped with the first type dopant. The body region is doped with a second type dopant. The second type dopant has a doping profile within the body region that varies with distance from the source region.

In another aspect, a vertical semiconductor device includes a semiconductor substrate. A source, a drain, and a body are formed in the semiconductor substrate. A threshold voltage within the body varies with vertical distance from the source region.

In another aspect, a vertical Fin-FET semiconductor device includes a semiconductor substrate. A vertical semiconductor fin is formed in the semiconductor substrate. A source region is located within the fin. A drain region is located within the fin. A body region is located within the fin between the source region and the drain region. First and second gate conductors are arranged along vertical sidewalls of the fin. A threshold voltage within the body region varies with distance from the source region.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals and/or letters in the various examples. This repetition is for simplicity and clarity and does not in itself dictate a relationship between the various embodiments and/or configurations discussed.

DETAILED DESCRIPTION

Overview

In one aspect an example vertical transistor includes a source region, a drain region, and a body region located between the source region and the drain region. The source and drain regions are doped with a first type dopant. The body region is doped with a second type dopant. A doping profile of the second type dopant within the body region varies as a function of distance from the source region. The variation in doping profile within an example body results in a corresponding variation in local threshold voltage within the body as a function of distance from the source region. More particularly, an example a first portion of the body includes a higher concentration of the second type dopant and a second portion of the body includes a lower concentration of the second type dopant. A threshold voltage of the first portion of the body that includes the higher concentration of the second type dopant is higher than a threshold voltage of the second portion of the body that includes the lower concentration of the second type dopant. In operation, the example vertical transistor turns on when a gate voltage imparts a voltage to the base that exceeds both the lower threshold voltage and the higher threshold voltage. While the transistor is turned on, the gate voltage overdrives the lower threshold voltage second portion of the body such that a contribution of the lower threshold second portion of the body to the on-resistance ($R_{ON}$) is less in proportion than the second portion's length than a contribution of the higher threshold first portion of the body to $R_{ON}$ in proportion to the first portion's length. Conversely, when the example vertical transistor is in an off-state, both the lower threshold voltage second portion of the body and higher threshold first portion of the body contribute about equally, in proportion to their lengths, to off-state resistance, and therefore, to avoiding voltage breakdown. Thus, variation in threshold voltages within an example body region can reduce $R_{ON}$ without reducing BV. Therefore, an improved tradeoff between $R_{ON}$ and BV is achieved in an example vertical transistor through variation of doping density within a body region, as a function of distance from a source region.

Figure 1:
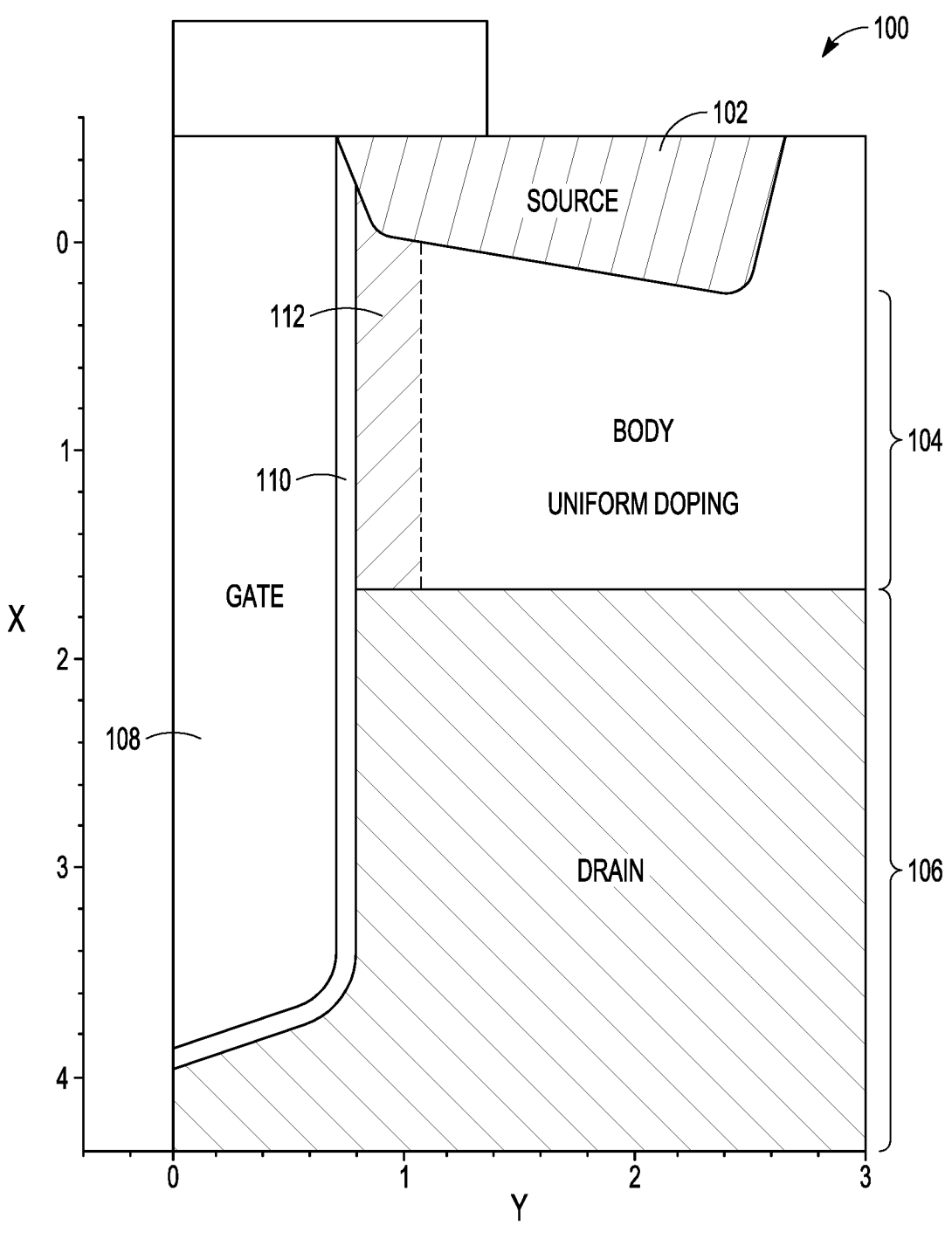
FIG. 1 is an illustrative cross section of a known vertical power transistor with uniform body doping.
Figure 2A:
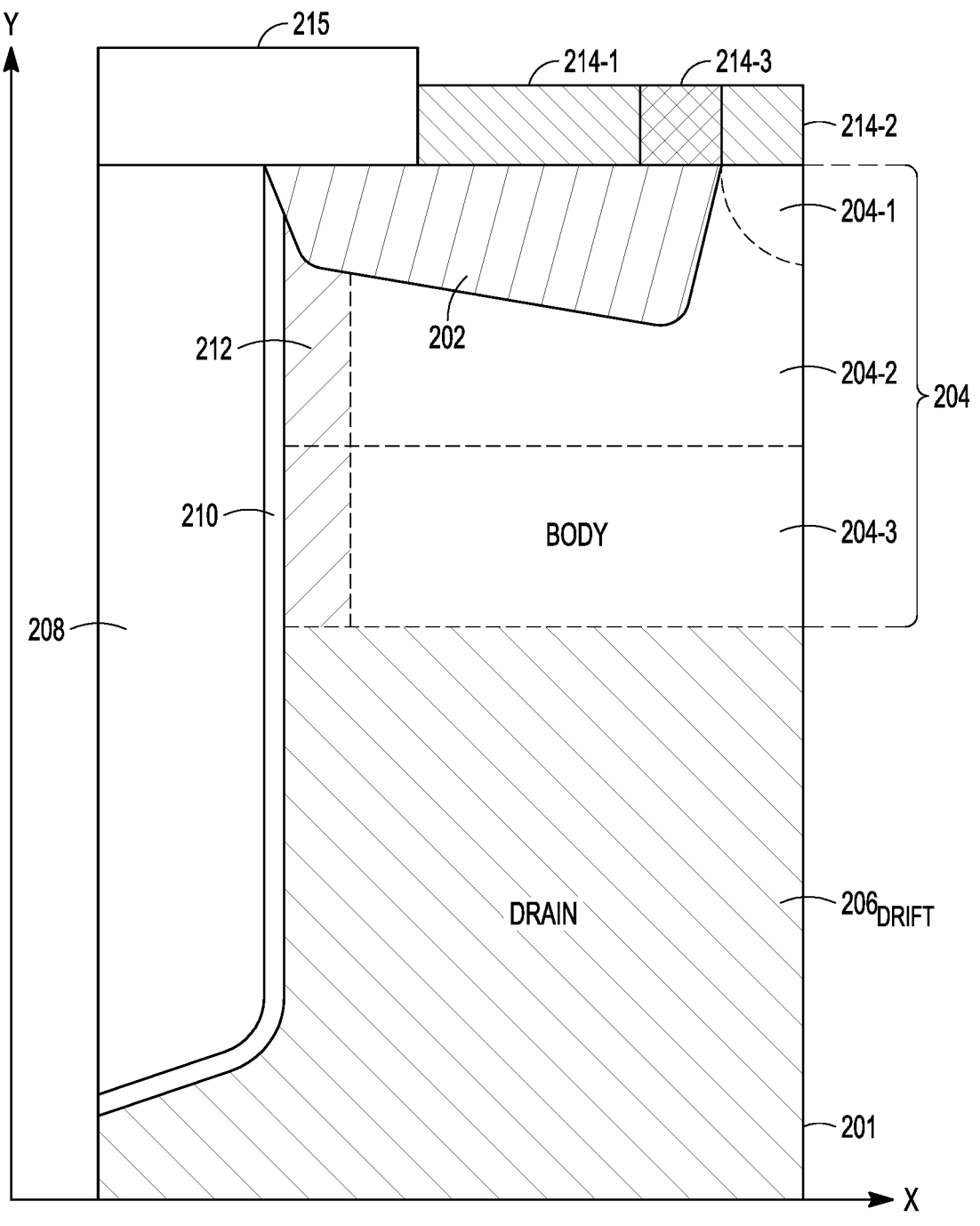
FIG. 2A is a first illustrative cross section drawing of an example vertical transistor with a body, located between a source and a drain, that has a doping profile that varies with vertical location within the body.

FIG. 2A is a first illustrative cross section drawing of an example vertical transistor 200 with a body 204 that has a doping profile that varies with vertical location within the body. The transistor 200 includes a semiconductor substrate layer 201 in which a source 202, a body 204, and a drain 206 are formed. The source, body and drain are aligned vertically with respect to the substrate layer 201 with the source 202 near the top of the substrate 201, the drain 206 nearer to the bottom of the substrate and the body 204 in between them. FIG. 2A shows a y-axis aligned with a vertical direction between the substrate source and drain regions 202, 206 within the substrate 201. During on-state operation, current flows vertically within the transistor 200 through the body 204 between the source 202 and the drain 206. The source 202 and drain 206 are doped with a first type dopant and the body 204 is doped with a second type dopant. The first type dopant and the second type dopant have opposite polarities. In an example vertical transistor, the substrate 201 is Silicon Carbide. In an example n-type transistor 200, the first type dopant is n-type and is Nitrogen, and the second type dopant is p-type and is one of Boron, Aluminum or Gallium. The dopant types are reversed for a p-type transistor. The transistor 200 also includes a conductive gate structure 208 coupled to receive a voltage to and to impart the voltage to the base 204 to control transistor on/off state. In an example transistor 200, the gate structure 208 is formed of a metal material or Polysilicon. An insulator layer 210, such as Silicon dioxide, Hafnium oxide, or Aluminum oxide, is located between the gate 208 and the body 204, source 202, and drain 206. Charge inversion can occur in a conduction channel region 212 of the body 204 in response to a gate voltage exceeding a threshold voltage between source and drain. The conduction channel 212 can be located at the insulator/body interface or can be buried within the body 204 at a location (not shown) displaced from the insulator/body interface.

In an example transistor 200, a source contact conductor 214-1 overlays and electrically contacts the source 202, and a body contact conductor 214-2 overlays and electrically contacts the body 204 adjacent to the source 202. An insulator 214-3 is coupled between the source and body contacts 214-1, 214-2 to electrically isolate them from one another. The source contact 214-1 and the body contact 214-2 can be coupled to different external source voltages (not shown). An insulator material 215 at a top portion of the substrate 201, extends over a top end portion of the gate 208 and a portion of the source 202 that is adjacent to the gate 208. In an example alternative transistor (not shown) a single source overlays and electrically contacts both the source 202 and the surface region 216 adjacent to the source 202.

An example source 202 has a first dopant concentration of about 9.55 e+19/cm³. An example body 204 includes a first body portion 204-1 nearest the body contact 214-2 at the top of the substrate 201 with a second dopant concentration of about 1 e+19/cm³. The example body 204 includes a second body portion 204-2 with an example second dopant concentration of about 1.529 e+19/cm³ and includes a third body portion 204-3 with a third dopant concentration of about 2.003 e+16/cm³. The second body portion 204-2 is located vertically closer to the source 202 than is the third body portion 204-3. Thus, a doping profile within the body 204 varies with vertical distance from the source 202. An example first drain portion 206$_{DRIFT}$, also referred to as the drift region of the drain is located adjacent to the body 204 and has a first dopant concentration of about 2 e+17/cm³.

Figure 6:
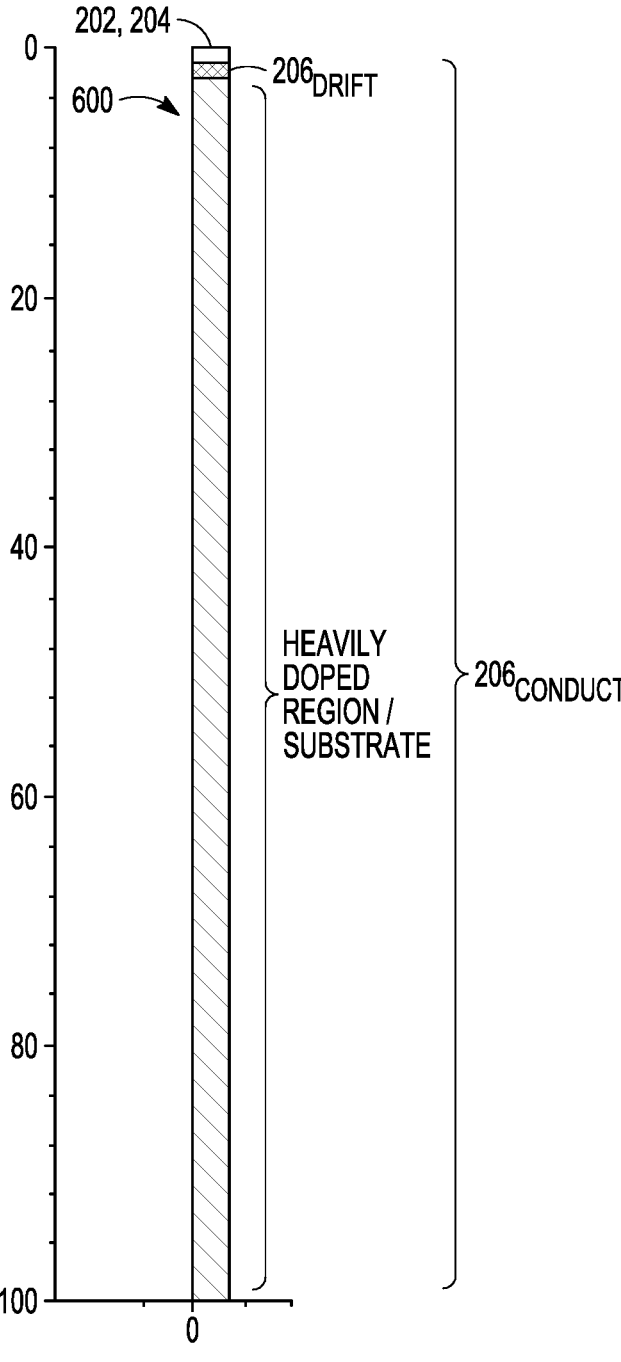
FIG. 6 is an illustrative drain doping profile.

The second dopant concentration decreases in at least a portion of the body 204, with increasing distance from the source region 202 and with decreasing distance from the drain region 206$_{DRIFT}$. The second body portion 204-2, which is closer to the source 202 and more distant from the drain 206, has a higher second dopant concentration than the third body portion 204-3, which is more distant from the source 202 and closer to the drain 206. The drain 206 is more lightly doped in a drift drain region 206$_{DRIFT}$ located closer to the body 204 and is more heavily doped in a more conductive drain region 206$_{CONDUCT}$ that is located deeper within the substrate 201, vertically spaced farther apart from the body 204. FIG. 6, which is discussed below, shows the more heavily doped conductive drain region that extends vertically even deeper within the substrate 201, even more distant from the body 204. An example more heavily doped, more conductive drain region $206_{CONDUCT}$ has an example first dopant concentration of about 9.55 e+19/cm$^3$. A role of the more lightly doped drift drain region $206_{DRIFT}$ is to block high electric field when the example transistor 200 is turned off. For instance, in an example application, when the transistor 200 is turn off, the source 202 could be 0V. The gate 208 could be 0V. While the drain could be 1,000V. The drain's drift region blocks such electric filed from impacting the device 200.

Variation in second dopant concentration with vertical distance from the source (and drain) within the body 204 can be achieved using multiple implantations or in-situ doping during epitaxial growth, for example. The second body portion 204-2 with the higher second dopant has a correspondingly higher threshold voltage than the third body portion 204-3 with the lower second dopant concentration. For example, a higher second dopant concentration in the second body portion 204-2 results in the second body portion 204-2 having a larger local threshold voltage $V_{TH}$ than the third body portion 204-3 that is more distant from the source 202 (and closer to the drain 206). In general, turn-on resistance $R_{ON}$ depends upon how much higher the gate voltage is higher than the threshold voltage $V_{TH}$, and therefore, a lower threshold voltage results in a lower value of $R_{ON}$. In an example transistor 200, the doping profile in the example body region 204 is such that at least the example second body portion 204-2, which is located vertically nearer the source region 202 (and vertically farther from the drain) has a threshold voltage that is at least 0.3V greater than a threshold voltage of the example third body portion 204-3, which is located vertically more distant from the source region (and vertically closer to the drain). The example vertical transistor 200 is disclosed having a doping profile that varies with vertical distance to reduce $R_{ON}$ and to also increase, or to at least not significantly decrease, breakdown voltage (BV).

Figure 2B:
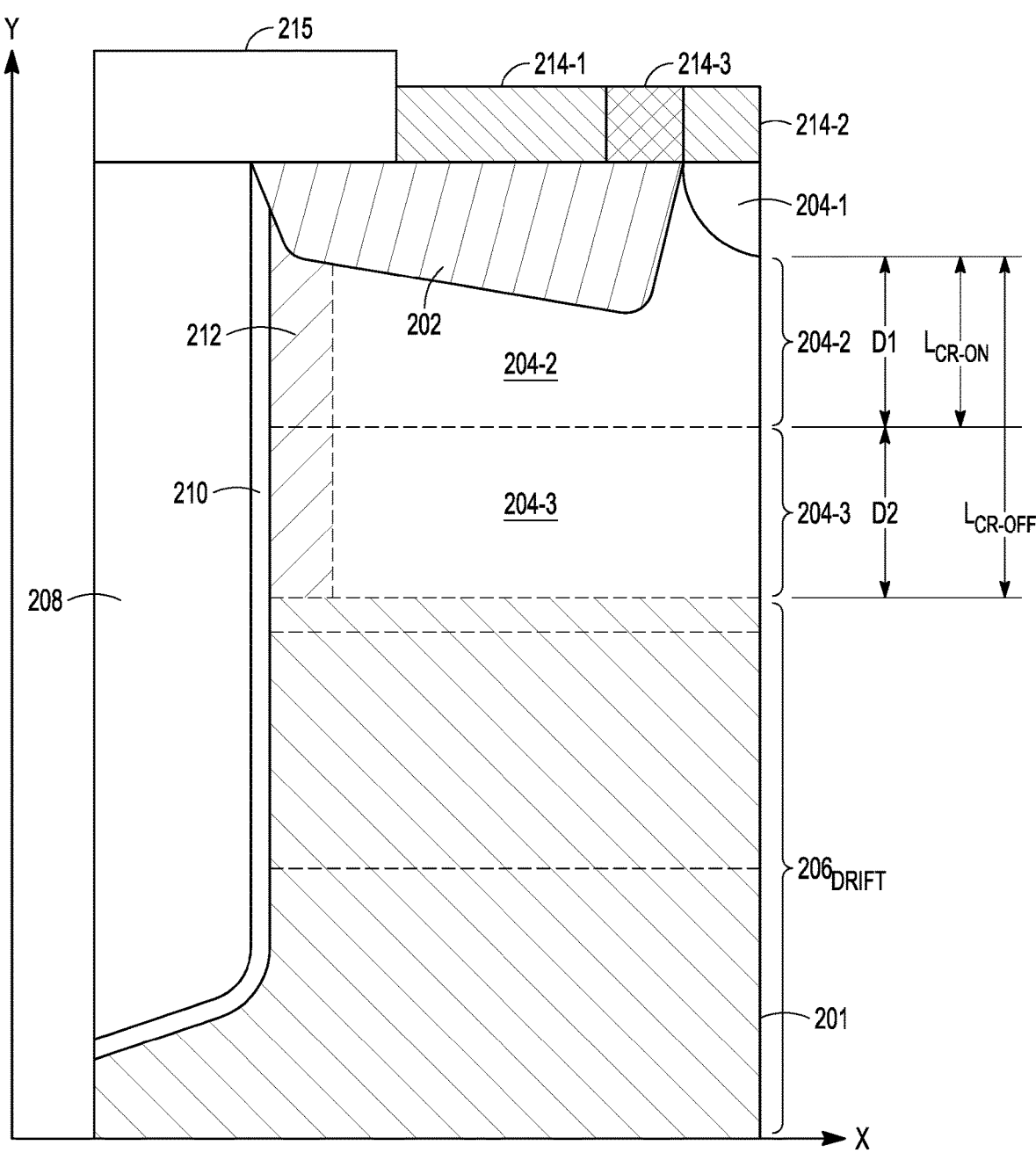
FIG. 2B is a second illustrative cross section drawing of the example vertical transistor of FIG. 2A annotated to indicate representative effective resistor lengths during on-state and off-state operation.

FIG. 2B is a second illustrative cross section drawing of the example vertical transistor 200 annotated to indicate representative effective resistor lengths during on-state and off-state operation. The illustrative vertical transistor 200 has a body dopant concentration profile that includes an example second dopant concentration at a constant first level (e.g., about 1.529 e+19/cm$^3$) throughout the second body portion 204-2 and that includes an example second dopant concentration at a constant second level (e.g., about 2.003 e+16/cm$^3$) throughout the third body portion 204-3. The example second body portion 204-2 extends a first vertical distance interval D1 within the body portion 204. The example third body portion 204-3 extends a second vertical distance interval D2 within the body portion 204. Thus, the example second type dopant profile exhibits a step-like transition in doping levels between the second and third body portions. As a consequence, effective on/off channel resistor lengths can be approximated by observation. As shown in FIG. 2B, the on-state effective channel resistor length $L_{CR-ON}$ is less than the off-state effective channel resistor length $L_{CR-OFF}$. For other doping profiles that feature changes in doping levels that are more variable with vertical distance for source/drain or that include a larger number of different second dopant concentrations that are not so sharply stepwise demarcated, the effective channel lengths cannot be so easily determined by observation.

However, it is still the case that the effective $L_{CR-ON}$ is smaller than the effective $L_{CR-OFF}$ in such alternative doping profiles.

Still referring to FIG. 2B, in the on-state, $R_{ON}$ is determined based upon the shorter effective channel resistor length $L_{CR-ON}$, and in the off-state, the BV is determined based upon the longer effective channel resistor length $L_{CR-OFF}$. For instance, in a hypothetical example, vertical transistor 200 constructed according to this disclosure, the second body portion 204-2 has a higher doping concentration and $V_{TH}$ of 5V and the third body portion 204-3 has a lower doping concentration and a $V_{TH}$ of 1V. Assuming, that during on-state operation, a gate voltage of 10V is applied to the gate 208, then the gate overdrive voltage ($V_G$-$V_{TH}$) in the higher dopant concentration second body portion 204-2 is 10V–5V=5V and the gate overdrive voltage in the lower dopant concentration third body portion 204-3 is 10V–1V=9V. In this example, during on-state operation of the example transistor 200, the larger overdrive voltage (9V) in the third body portion 204-3 has the effect reducing the resistance level within the third body portion 204-3 and thereby effectively shortening the effective channel resistor length within the body 204 to be $L_{CR-ON}$, which is the vertical length D1 of the second body portion 204-3. Therefore, the value of $R_{ON}$ in the example transistor 200 is determined primarily body upon the vertical length D1 of the second body portion 204-2, which is subjected to a lower overdrive voltage. However, during the off-state operation of the example transistor 200, both the second body portion 204-2 and the third body portion 204-3 are in off-state and the effective channel resistor length $L_{CR-OFF}$ is the combined vertical lengths (D1+D2) of the second and third body portions, such that both the second and third body portions contribute to blocking voltage breakdown.

In an alternative example vertical transistor (not shown), the second dopant concentration increases in at least a portion of the body, with increasing vertical distance from the source and decreasing vertical distance from the drain. In the alternative example vertical transistor, a lower doping concentration less distant from the source results in a lower local threshold voltage $V_{TH}$ nearer the source, which results in the portion of the channel region nearer the source having a lower threshold voltage than a portion of the channel region that is more distant from the source. Moreover, alternatively, Diamond or beta-Gallium Oxide substrates can be used in the transistor. Also, a GaN can be used if p-type doping is realizable.

Figure 3:
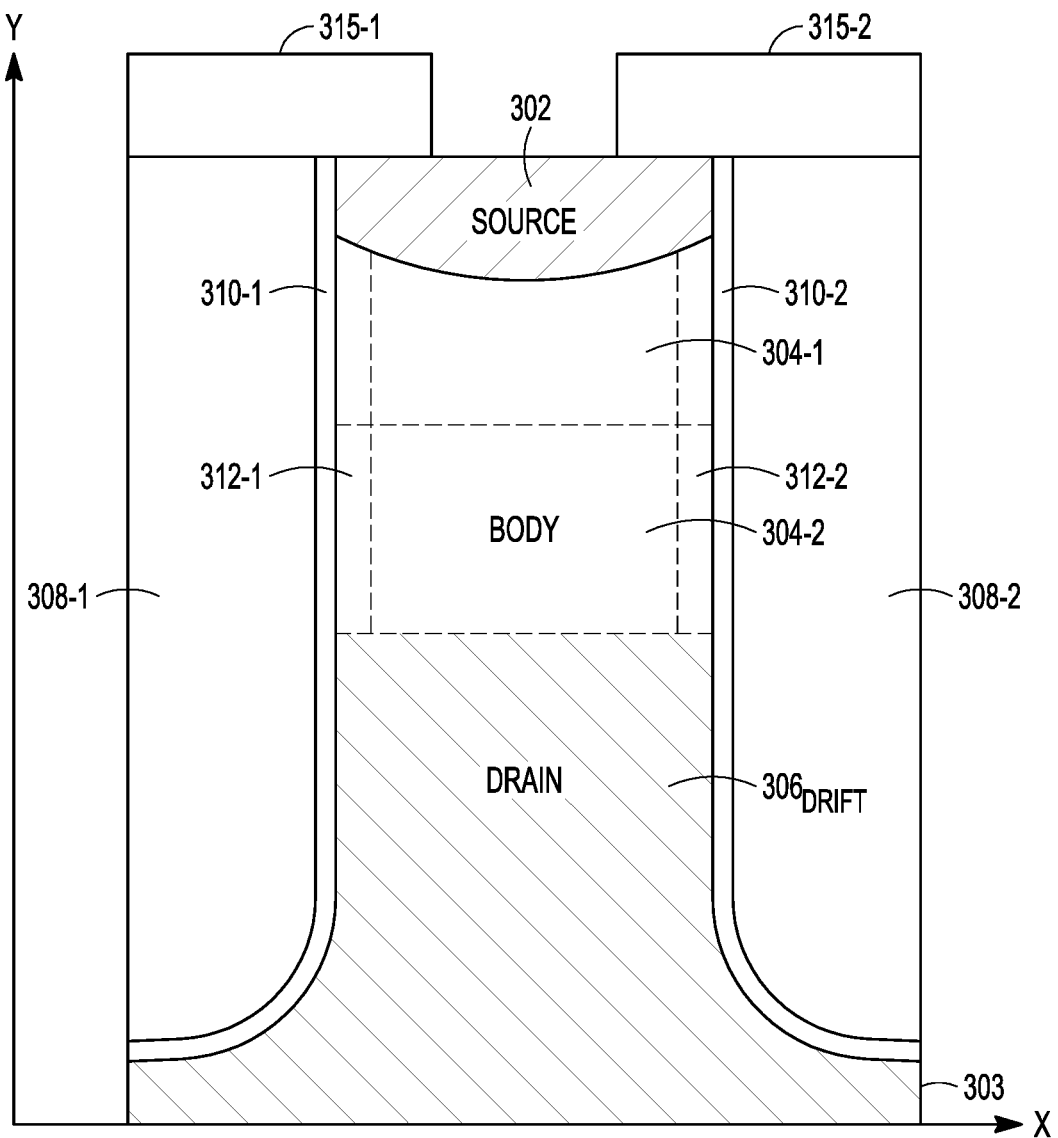
FIG. 3 is an illustrative cross-sectional view of a vertical Fin-FET device with variable channel doping.

FIG. 3 is an illustrative cross-sectional view of a vertical Fin-FET device 300 with variable channel doping. The device 300 includes a vertical semiconductor fin 301 formed in a substrate layer 303. A source region 302 is located within a top portion of the semiconductor fin 301. A drain region 306 is located at a bottom portion of the semiconductor fin 302. A body region 304 is located between the source and drain regions. The source, body and drain are aligned vertically with respect to a substrate layer 303 in which they are formed with the source 302 near the top of the substrate 303, the drain 306 nearer the bottom of the substrate 303 and the body 304 in between them. FIG. 3 shows a y-axis aligned with a vertical direction between the substrate source and drain regions 302, 306 within the substrate fin 301. During on-state operation, current flows vertically within the Fin-FET device 300 through the body 304 between the source 302 and the drain 306. First and second gate conductors 308-1, 308-2 conductors are arranged along vertical sidewalls of the semiconductor fin 302. The gate conductors 308-01, 308-2 can be formed from metal or polysilicon. Thin insulators 310-1, 310-2 are disposed between respective gate conductors 308-1, 308-2 and the vertical sidewalls of the semiconductor fin 302. An insulator material 315 at a top portion of the fin 301, extends over a top end portion of the gates 308-1, 308-2 and portions of the source 302 that are adjacent to the gates 308-1, 308-2. First and second vertical conduction channel regions 312-1, 312-2 are located within the body 304 and extend parallel to the first and second gate conductors 308-1, 308-2. The source region 304 is heavily doped with a first type dopant. The drain region 306 is more lightly doped with the first type dopant to act as a drift drain region. The body 304 is doped with a second type dopant. In an example Fin-FET device 300, the first type dopant is n-type, and the second type dopant is p-type dopant. The second type dopant has a doping profile within the body 304 in which a doping concentration of the second dopant is higher in a first body portion 304-1 that is vertically nearer the source 302 region than in a second body portion 304-2 that is vertically more distant from the source 302 the drain region. In an alternative example Fin-FET device (not shown), the doping level increases in at least a portion of the body, with increasing distance from the source region and decreasing distance from the drain region.

An example source 302 near the at the top of the fin 301 has a first dopant concentration of about $9.55\ e+19/cm^3$. The example body 304 includes a first body portion 304-1 with a second dopant concentration of about $1.529\ e+19/cm^3$ and includes a third body portion 304-2 with a second dopant concentration of about $2.003\ e+16/cm^3$. The first body portion 304-1 is located vertically closer to the source 202 than is the second body portion 204-2. Thus, a doping profile within the body 304 varies with vertical distance from the source 302. An example drain 306, which can act as a drift drain is located adjacent to the example body 304 and has a first dopant concentration of about $2.251\ e+17/cm^3$.

Thus, a second dopant concentration profile within the base 304 varies with vertical distance from the source 302 and varies with vertical distance drain 302. For the same reasons set forth in the disclosure above with reference FIGS. 2A-2B and to transistor 200, during on-state operation of the example vertical fin-FET device 300, a larger overdrive voltage in the second body portion 304-2 has the effect reducing the resistance level within the second body portion 304-2 and thereby effectively shortening the effective channel resistor length within the body 304, to a length that corresponds to a vertical length of the more highly doped first body portion 304-1. Therefore, a value of $R_{ON}$ in the example fin-FET device 300 is determined primarily based body upon a vertical length of the first body portion 304-1, which is subjected to a lower overdrive voltage than is the second body portion 304-2. Conversely, during off-state operation of the example fin-FET device 300, both the first body portion 304-1 and the second body portion 304-2 are in off-state and the effective channel resistor length is the combined vertical lengths of the first and second portions, such that both the first and second body portions contribute to blocking voltage breakdown.

Gradual channel doping of a vertical transistor channel has been shown to be an effective means to improve RON/BV trade off in junctionless devices. See, Johan Saltin, Shiyang Tian, Fei Ding and Hiu Yung Wong, "Novel Doping Engineering Techniques for Gallium Oxide MOSFET to Achieve High Drive Current and Breakdown Voltage," IEEE 7th Workshop on Wide Bandgap Power Devices and Applications, Raleigh, NC, 2019, pp 261-264. However, gradual doping has not been disclosed in an inversion mode device or in Silicon Carbide. The inventor realized that in a junctionless device, lower channel doping at the drain edge results in lower BV. See J. Saltin et al. Supra. However, in the vertical transistor disclosed herein, lower doping in a portion of the channel can increase BV. This is because a pn junction exists in an inversion mode device but not in a junctionless device and BV is increased when a pn junction is less steeply graded.

It is also noted that lower doping within portion of the base 304 near the drain 306 also can reduce the spreading resistance to allow the first type of carrier to reach the drain 306 more easily as they can move to the middle of the conduction channels 312-1, 312-2 from 310/312 interfaces when the doping level of the second type is lower. This can further reduce the $R_{ON}$.

Example Doping Profiles

Figure 4A:
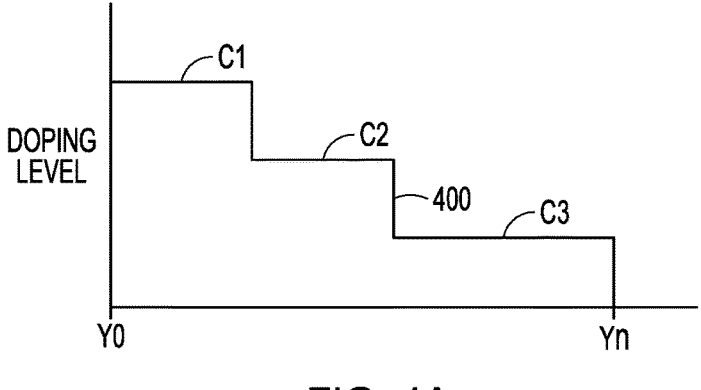
FIGS. 4A-4D are illustrative drawings representing multiple different variable example body doping profiles.
Figure 4B:
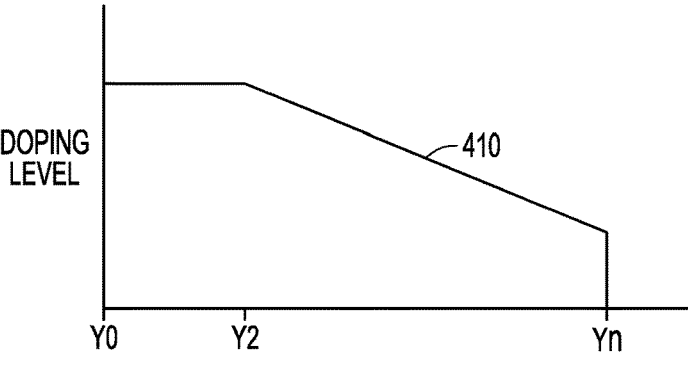
Figure 4C:
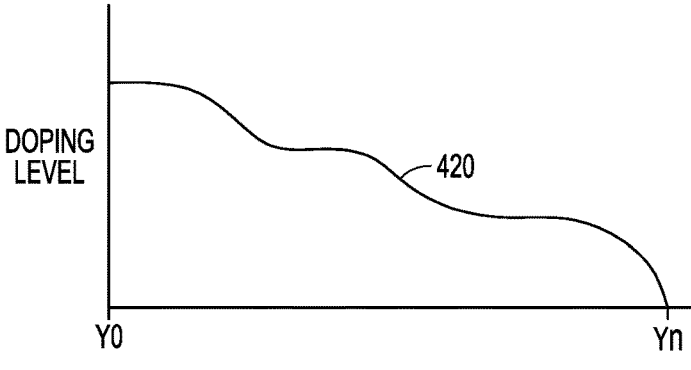
Figure 4D:
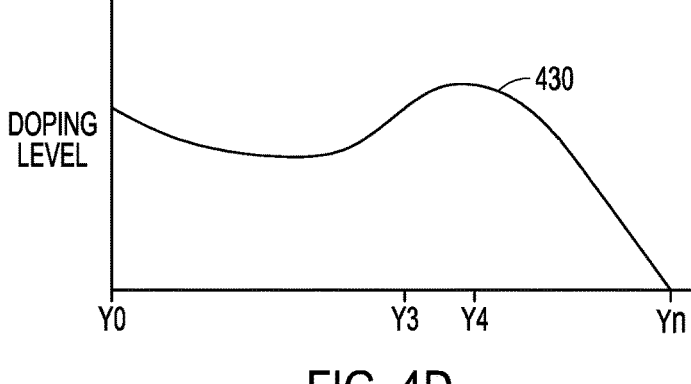

FIGS. 4A-4D are illustrative drawings representing multiple different example body doping profiles for an example body, such as body 204 or body 304, that extends from the edge of a source region (y0) to an edge of a drain (yn) region. In the example doping profiles of FIGS. 4A-4C, the doping profile decreases with increasing distance from the source region. In FIG. 4D, the doping profile has a segment that increases with increasing distance from the source region. It is contemplated that doping in accordance with the doping profiles of each of FIGS. 4A-4D will result in a favorable trade-off between achieving a low on-state resistance and a high off-state breakdown voltage A first example doping profile 400 in FIG. 4A monotonically decreases with increasing distance from the source edge y0, in an approximate stepwise distribution in which a first doping portion C1 has a constant highest doping level, a third step portion C3 has a constant lower doping level and a middle step portion C2 has a constant middle doping level between the doping levels C1 and C3. An example stepwise doping curve can have n doping steps with n being between two and ten. A second example doping profile 410 in FIG. 4B monotonically decreases with increasing distance from the source edge y0, with an approximately smooth slope between y2 and yn. In the second example curve 410, the doping profile is approximately constant between y0 and y2 and decreases incrementally between y2 and yn. A third example doping profile 420 in FIG. 4C monotonically decreases with increasing distance from the source edge y0 in a seeming arbitrary manner determined to achieve maximum the benefit through TCAD simulation or machine learning, for example. A fourth example doping profile 430 has a doping profile that decreases gradually between y0 and y3, that follows a curve that increases between y3 and y4 and that decreases between y4 and yn and in which the doping level between y3 and y4 reaches a doping concentration that is greater than the doping concentration between y0 and y3. The doping concentrations in each of the curves 400-430 are expected to be between $1\ e+19/cm^3$ to $1\ e+14/cm^3$. Note that this same approach can be applied to p-type MOSFET with the channel being n-type and S/D being p-type.

Fabrication Flow:

To achieve a gradual doping profile that varies with vertical depth, one can use multiple implantations or variable in-situ doping when growing the body region, through multiple implantations, for example. Therefore, there is little modification required to typical fabrication processes. The disclosed variable doping can be achieved more readily in a vertical transistor than in a traditional horizontal transistor, because it is generally not possible to achieve non-constant doping horizontally. For typical vertical Silicon devices, dopants can diffuse (move around) substantially and defeat the purpose due to high-temperature treatment after channel formation. High voltage power transistors are usually vertical. The inventor realized that it is possible to have gradual doping with a negligible increase in fabrication cost. Wide-bandgap materials such as Silicon Carbide, Gallium Nitride, Gallium Oxide, Diamond, or Boron Nitride are used for better performance in power electronics. The inventor realized that dopants in such wide-bandgap materials usually do not diffuse and, therefore, the doping profile will still be intact (i.e. the doping shape is not changed) even after thermal additional thermal treatments.

Simulation Setup:

Technology Computer Aided Design (TCAD) is used to simulate variable doping level within the channel that increases in at least a portion of the channel, with increasing distance from the source region and decreasing distance from the drain region and to simulate transistor performance such as $R_{ON}$ and BV. TCAD is a partial differential equation solving tool that is widely used in the industry to predict the performance of transistors before fabrication. The relevant models have been included and calibrated to experiment in the literature. TCAD has been used extensively in industries for production. See, J. Wu and C. H. Diaz, "Expanding role of predictive TCAD in advanced technology development," 2013 International Conference on Simulation of Semiconductor Processes and Devices (SISPAD), Glasgow, 2013, pp. 167-171, doi: 10.1109/SISPAD.2013.6650601; and M. A. Stettler, "Device and process modeling: 20 Years at Intel's other fab," 2014 International Conference on Simulation of Semiconductor Processes and Devices (SISPAD), Yokohama, 2014, pp. 13-16, doi: 10.1109/SISPAD.2014.6931551. More importantly, TCAD has been used to predict novel devices before they are available experimentally.

Figure 5:
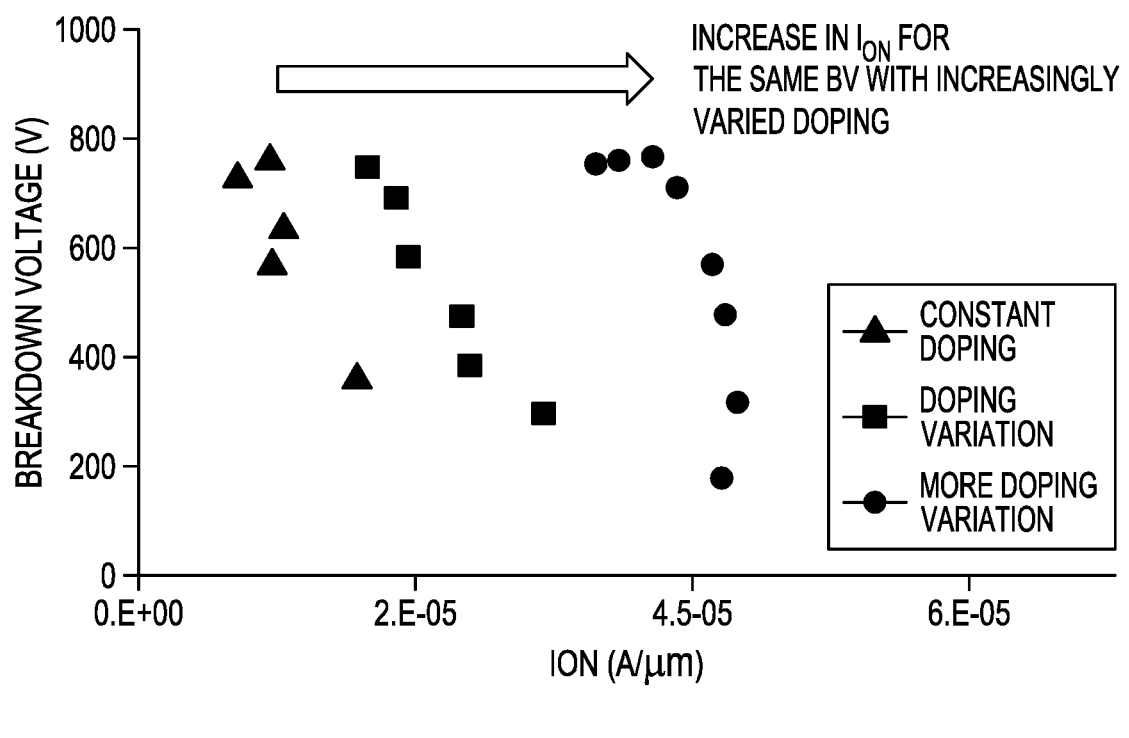
FIG. 5 is an illustrative drawing showing $R_{ON}$-BV trade-off curves.

Performance Evaluation:

FIG. 5 is an illustrative drawing example showing example $R_{ON}$-BV trade-off curves. Physical simulations show that using the disclosed vertical transistor produced using current fabrication techniques, has a transistor current can increases by approximately 2-4 times over transistors with uniform channel doping. The channel doping near the source region is set to a regular level (usually high), which makes it more difficult to change to the same type of source and drain (thus high $V_{TH}$) in that region. But the channel doping near the drain region is set to low and thus has low $V_{TH}$. In off-state, due to the so-called cascode effect, the $V_{TH}$ of the BV of the whole device is determined by the $V_{TH}$ at the source (i.e. high). The leakage current is also low and BV is high. BV is higher than regular device because the doping gradient between the channel near the drain and the drain is smaller now (as channel doping near the drain is low). In the on-state, the channel region near the drain has low $V_{TH}$ and thus it is very conductive (low $R_{ON}$) because (VG-$V_{TH}$) is large. Therefore, low $R_{ON}$ and high BV can be achieved at the same time. Thus, with gradual doping within the channel region that decreases with increasing distance from the source region, low $R_{ON}$ (high $I_{ON}$) can be achieved for about the same BV.

Drain Doping Profile:

FIG. 6 is an illustrative drain doping profile 600. The illustrative drain doping profile 600 includes at its top the source region 202 and the body region 204. As explained above with reference to FIG. 2B, a drift drain portion 206$_{DRIFT}$ has a doping concentration of about 2.251 e+17/cm³, which is more lightly doped than conductive drain portion 206$_{CONDUCT}$ that has a doping concentration of about 9.55 e+19/cm³. The vertical axis in FIG. 6 is illustrative and provides an indication (not to scale) of the vertical dimensions of the body 204, the more lightly doped drift drain portion 204$_{drift}$ acts as a drift region and the more heavily doped conductive drain portion 206$_{CONDUCT}$ extends vertically deeper into the substrate region 201. A device is contemplated having a vertical transistor (source, body drift drain) with a vertical (y-direction) dimension of about 15 microns and a substrate with a vertical dimension of about 100-500 microns. Similar drift and conduct drain regions are formed in an example fin-FET transistor (not shown).

Example Circuit Environment

Figure 7:
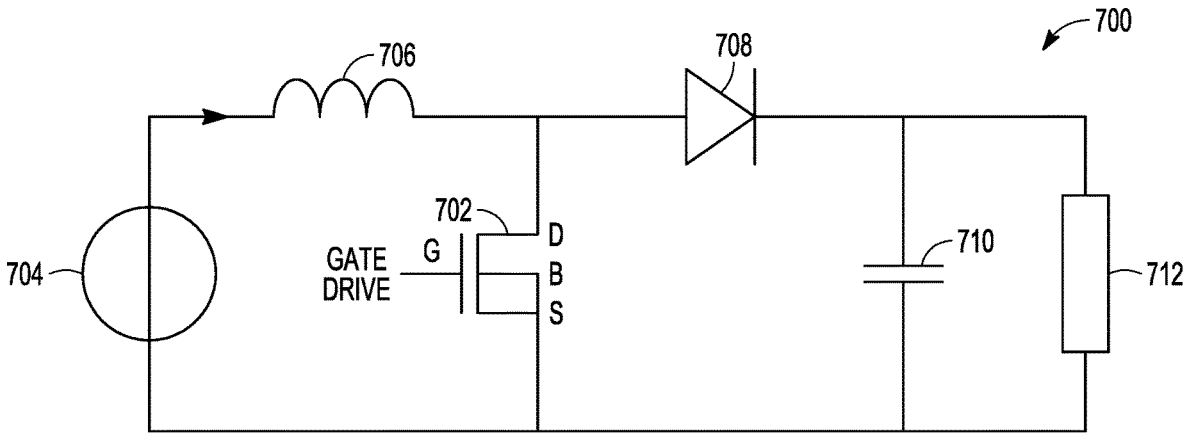
FIG. 7 is an illustrative schematic diagram of an example boost converter circuit that includes a power transistor.

FIG. 7 is an illustrative schematic diagram of an example boost converter circuit 700 that includes a power transistor 702. The boost circuit 700 includes a voltage source 704, inductor 706, power transistor 702, diode 708, capacitor 710, and load 712, coupled as shown. The power transistor 702 includes four terminals source (S), drain (D), base (B), and gate (G), coupled as shown. A threshold voltage applied at the gate (G) between source (S) and base (B) controls on/off operation of the power transistor. The operation of the boost converter circuit 700 is well known to persons skilled in the art and will not be described herein.

The above description is presented to enable any person skilled in the art to create and use variable doping of a body region of a vertical transistor. Various modifications to the embodiments will be clear to those skilled in the art, and the generic principles defined herein may be applied to other embodiments and applications without departing from the spirit and scope of the invention. In the preceding description, numerous details are set forth for explanation. However, one of ordinary skill in the art will realize that the circuitry might be practiced without the use of these specific details. In other instances, well-known circuits and processes are shown in block diagram form in order not to obscure the description of the invention with unnecessary detail. Identical reference numerals may be used to represent different views of the same or similar item in different drawings and in the specification. Thus, the foregoing description and drawings of embodiments in accordance with the present invention are merely illustrative of the principles of the invention. Therefore, it will be understood that various modifications can be made to the embodiments by those skilled in the art without departing from the spirit and scope of the invention, which is defined in the appended claims.

The invention claimed is:

1. A vertical semiconductor transistor, comprising:
   a source region;
   a drain region;
   a body region; and
   wherein the body region is located between the source region and the drain region;
   wherein the source region is doped with a first type dopant;
   wherein the drain region is doped with the first type dopant;
   wherein the body region is doped with a second type dopant; and
   wherein the second type dopant has a doping profile, within the body region, which extends from an edge where the source region and the body region meet to an edge where the drain region and the body region meet, that monotonically decreases, throughout the body region, with distance from the source region.

2. The vertical semiconductor transistor of claim 1, wherein the doping profile of the second dopant within the body region is higher nearer the source region than nearer the drain region.

3. The vertical semiconductor transistor of claim 1 further including:
a gate that is coupled to impart a voltage to the body region.

4. The vertical semiconductor transistor of claim 1, wherein the source region, drain region, and body region are formed in a Silicon Carbide semiconductor substrate.

5. The vertical semiconductor transistor of claim 1, wherein the source region, drain region, and body region are in a substrate that comprises Silicon Carbide; and wherein the first dopant comprises Nitrogen; and wherein the second dopant comprises a dopant selected from the group: Boron, Aluminum, Gallium.

6. The vertical semiconductor transistor of claim 1, wherein the drain region includes a first drain portion and a second drain portion;
wherein the first drain portion is located between the body region and the second drain portion; and
wherein the first drain portion has a lower doping concentration of the first type dopant than does the second drain portion.

7. The vertical semiconductor transistor of claim 1 further including:
a semiconductor substrate; and
a conductive gate;
wherein the source region, the drain region and the body region are in the semiconductor substrate;
wherein the drain region of the substrate includes a drift drain region and a conductive drain region;
wherein the conductive drain region is doped with a higher concentration of the first dopant than is the drift drain region;
wherein the source region, the drain region, and the body region are aligned vertically within the semiconductor substrate with the source region located nearer to a top portion of the substrate, and the drain region located nearer to a bottom portion of the substrate;
wherein the drift drain region and the conductive drain region are vertically aligned within the substrate with the drift drain region extending vertically from the body region to the conductive drain region and with the conductive drain region extending vertically between the drift drain region and the bottom portion of the substrate; and
wherein the conductive gate extends vertically adjacent to the body region, from the source region to the drift drain region.

8. The vertical semiconductor transistor of claim 7 further including:

an insulator layer that extends between the gate and the body region, between the gate and the source region, and between the gate and the drift drain region.

9. The vertical semiconductor transistor of claim 8, wherein the conductive grate does not extend vertically adjacent to the conductive drain region, and the insulator layer does not extend between the gate and the conductive drain region.

10. The vertical semiconductor transistor of claim 7, wherein a voltage imparted to the gate can control on/off state of the transistor through control of charge inversion within the body region;
wherein during on-state operation, current flows vertically within the substrate from the source region to the body region, from the body region to the drift drain region, and from the drift drain region to the conductive drain region;
wherein during off-state operation, the drift drain region can block an electric field that can occur due to an occurrence of a voltage at the conductive drain region that is greater than a voltage at the gate and that is greater than a voltage at the source region.

11. The vertical semiconductor transistor of claim 7, wherein a voltage imparted to the gate can control on/off state of the transistor through control of charge inversion within the body region;
wherein the body region includes a first body portion and a second body portion;
wherein the first body portion is located vertically nearer to the source region than is the second body portion;
wherein during on-state operation, current flows vertically within the substrate from the source region to the first body portion, from the first body portion to the second body portion, from the second body portion to the drift drain region, and from the drift drain region to the conductive drain region;
wherein the second type dopant has a doping profile within the body region such that,
a local threshold voltage of the first body portion is different from a local threshold voltage of the second body portion,
during on-state operation, the first body portion has a different resistance than the second body portion, and
during off-state operation, both the first body portion and the second body portion contribute to blocking voltage breakdown that can occur due to a voltage at the conductive drain region exceeding a voltage at the gate and exceeding a voltage at the source region.

12. The vertical semiconductor transistor of claim 11, wherein during off-state operation, the drift drain region can block an electric field that can occur due to an occurrence of a voltage at the conductive drain region that is greater than a voltage at the gate and that is greater than a voltage at the source region.

* * * * *